(12) United States Patent
Hanafi

(10) Patent No.: US 7,710,765 B2
(45) Date of Patent: May 4, 2010

(54) BACK GATED SRAM CELL

(75) Inventor: Hussein I. Hanafi, Basking Ridge, NJ (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 11/862,387

(22) Filed: Sep. 27, 2007

(65) Prior Publication Data

US 2009/0086528 A1 Apr. 2, 2009

(51) Int. Cl.
*G11C 11/00* (2006.01)
(52) U.S. Cl. .................. 365/156; 365/171; 365/173
(58) Field of Classification Search .................. 365/156, 365/154, 171, 173
See application file for complete search history.

(56) References Cited

U.S. PATENT DOCUMENTS

| | | | |
|---|---|---|---|
| 5,521,524 A | 5/1996 | Houston | |
| 6,867,460 B1 | 3/2005 | Anderson et al. | |
| 6,924,560 B2 | 8/2005 | Wang et al. | |
| 7,084,461 B2 | 8/2006 | Anderson et al. | |
| 7,087,477 B2 | 8/2006 | Fried et al. | |
| 7,138,305 B2 | 11/2006 | Datta et al. | |
| 7,177,177 B2 | 2/2007 | Chuang et al. | |
| 7,198,990 B2 | 4/2007 | Joshi et al. | |
| 7,313,012 B2* | 12/2007 | Chuang et al. | 365/154 |
| 7,362,606 B2* | 4/2008 | Chuang et al. | 365/154 |
| 7,400,525 B1* | 7/2008 | Kim | 365/156 |
| 7,403,410 B2* | 7/2008 | Burnett | 365/154 |
| 2004/0222477 A1 | 11/2004 | Aller et al. | |
| 2005/0073060 A1 | 4/2005 | Datta et al. | |
| 2005/0255656 A1 | 11/2005 | Kang et al. | |
| 2005/0272195 A1 | 12/2005 | Bryant et al. | |
| 2006/0068531 A1 | 3/2006 | Breitwisch et al. | |
| 2006/0214233 A1 | 9/2006 | Ananthanarayanan et al. | |
| 2006/0255410 A1 | 11/2006 | Bernstein et al. | |

(Continued)

FOREIGN PATENT DOCUMENTS

WO WO 2004/059703 A1 7/2004

(Continued)

OTHER PUBLICATIONS

Bowonder, Anupama et al. "Subthreshold FinFET for Low Power Circuit Operation." Univ. of Cal., Berkeley. http://bwrc.eecs.berkeley.edu/classes/icdesign/ee241_s06/Prrojects . . . .

(Continued)

*Primary Examiner*—Anh Phung
*Assistant Examiner*—Hien N Nguyen
(74) *Attorney, Agent, or Firm*—Brooks, Cameron & Huebsch, PLLC.

(57) ABSTRACT

Methods, devices and systems for a back gated static random access memory (SRAM) cell are provided. One method embodiment for operating an SRAM cell includes applying a potential to a back gate of a pair of cross coupled p-type pull up transistors in the SRAM during a write operation. The method includes applying a ground to the back gate of the pair of cross coupled p-type pull up transistors during a read operation. The charge stored on a pair of cross coupled storage nodes of the SRAM is coupled to a front gate and a back gate of a pair of cross coupled n-type pull down transistors in the SRAM during the write operation and during a read operation.

25 Claims, 6 Drawing Sheets

U.S. PATENT DOCUMENTS

| | | | |
|---|---|---|---|
| 2007/0111406 | A1 | 5/2007 | Joshi et al. |
| 2007/0114612 | A1 | 5/2007 | Ahn et al. |
| 2007/0183185 | A1 | 8/2007 | Guo et al. |
| 2007/0189060 | A1 | 8/2007 | Inaba |
| 2007/0211517 | A1 | 9/2007 | Burnett |
| 2007/0212834 | A1 | 9/2007 | Anderson et al. |

OTHER PUBLICATIONS

Cakici, T. et al. "FinFET Based SRAM Design for Low Standby Power Applications." Quality Electric Design, 2007. ISQED '07.8th International Symposium. Mar. 2007. pp. 127-132.

Carlson, A. et al. "FinFET SRAM with Enhanced Read/Write Margins." 2006 IEEE International SOI Conference Proceedings. pp. 105-106.

Hanson, S. et al. "Ultralow-voltage, minimum-energy CMOS." IBM Journal of Research and Development. Advanced Silicon Technology. 2006. vol. 50, No. 4/5.

Huang, Xuejue. et al. "Sub 50-nm FinFET: PMOS." IEDM Tech. Digest, 1999 p. 67.

Ieong, M., et al. "Experimental Evaluation of Carrier Transport & Device Design for Planar Symmetric/Asymmetric Double-Gate/Ground . . . " Symp. VLSI Circuits Digest, 2001. 19.6.1.

Joshi, Rajiv V., et al. "A High-Performance, Low Leakage, and Stable SRAM Row-Based Back-Gate Biasing Scheme in FinFET Technology." VLSID'07 pp. 665-672.

La Rosa, G., et al. "Impact of NBTI Induced Statistical Variation to SRAM Cell Stability." Proc. IRPS, 2006 p. 274.

Lee, Y.H., et al. "Effect of pMOST Bias-Temperature instability on Circuit Reliability Performance." IEDM Tech. Digest, 2006, p. 353.

Mathew, L., et al. "CMOS Vertical Multiple Independent Gate Field Effect Transistor (MIGFET)." IEEE SOI Conf. Digest, 2004, p. 187.

Mueller, K., et al. "6-T Cell Circuit Dependent GOX SBD Model for Accurate Prediction of Observed VCCMIN Test Voltage Dependency." Proc. IRPS, 2006, p. 270.

Nowak, E.J., et al. "A Functional FinFET-DGCMOS SRAM Cell." IEDM Tech. Digest, 2002, p. 411.

Ramadurai, V., et al. "SRAM Operational Voltage Shifts in the Presence of Gate Oxide Defects in 90 NM SOI." Proc. IRPS, 2006, p. 270.

Reddy, V., et al. "Impact of Negative Bias Temperature Instability on Product Parametric Drift." ITC, 2004, p. 148.

Yamaoka, M. et al. "Low Power SRAM MEnu for SOC Application Using Yin-Yang-Feedback Memory Cell Technology." IEDM Tech. Digest, 2004, p. 288.

Koo, Bon Jae. "International Search Report," for related PCT Application, mailed Mar. 27, 2009. (3 pgs.).

Erik Marinissen, et al. "Challenges in Embedded Memory Design and Test." Proceedings of the Design, Automation and Test in Europe Conference and Exhibition (2005).

Harold Pilo. "2006 IEDM SRAM Short Course," IEDM SRAM Short Course, pp. 1-37. (2006).

John Wuu, et al. "The Asynchronous 24MB On-Chip Level-3 Cache for a Dual-Core Itanium-Family Processor," ISSCC 2005/ Session 26/ Static Memory/ 26.8., pp. 488-489, 618. (2005).

* cited by examiner

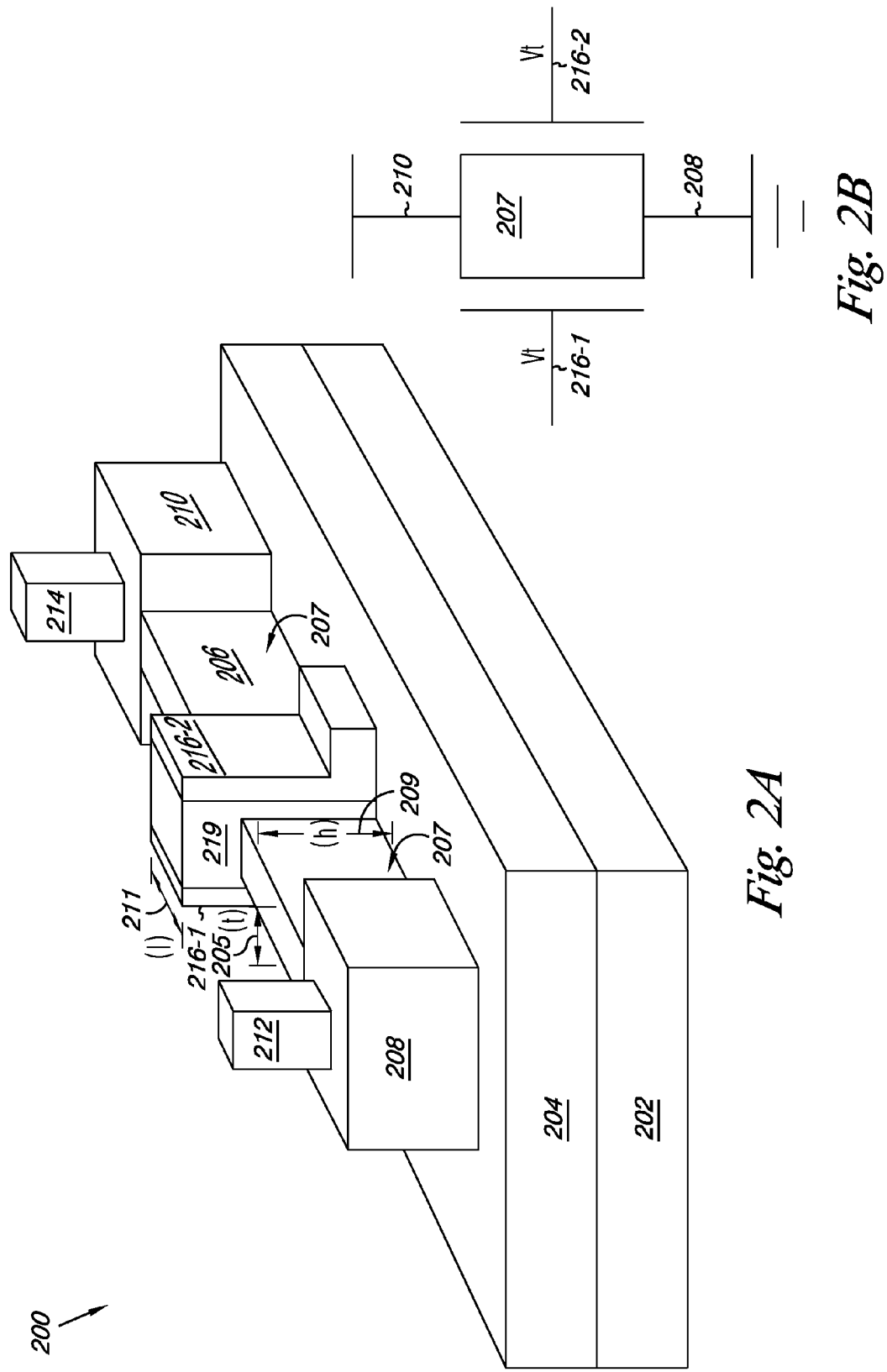

BACK GATED SRAM CELL

BACKGROUND

Static Random Access Memory (SRAM) arrays occupy a large fraction of the chip area in many of today's memory designs. As memory will continue to consume a large fraction of many future designs, scaling of memory density involves continuing to track the scaling trends of logic. With transistor and gate length scaling to 45 nanometer (nm) design rule node dimensions and smaller, increased transistor leakage and parameter variation present challenges for the scaling of six transistor (6-T) SRAM cells. As MOSFETs are scaled down, statistical doping fluctuations, oxide thickness variations and line-edge roughness increase the spread in transistor threshold voltage (Vt) which degrades SRAM cell stability and increases the transistor "on" and "off" currents. In order to limit static power dissipation in large caches, lower supply voltages can be used. However, a low supply voltage coupled with large transistor variability further reduces SRAM cell stability. In order to reduce the impact of these variations on devices threshold and memory cell stability, MOSFET devices with channel lengths longer than the particular design rule node dimensions are presently used in the SRAM cell design. This results in larger SRAM cell area which in turn increases the system on a chip device die size and its cost.

In previous approaches, for chip designers to maintain good read/write stability in an SRAM cell as the CMOS technology design rule node dimension is scaled downward, MOSFET transistors with channel lengths longer than the particular design rule have been employed.

BRIEF DESCRIPTION OF THE DRAWINGS

FIG. 2A illustrates an embodiment of a FinFET device implemented in an SRAM cell according to one or more embodiments of the present invention.

FIG. 2B is a schematic for the FinFET device shown in FIG. 2A.

DETAILED DESCRIPTION

Methods, devices and systems for a back gated static random access memory (SRAM) cell are provided. One method embodiment for operating a SRAM cell includes applying a potential to a back gate of a pair of cross coupled p-type pull up transistors in the SRAM during a write operation. The method includes applying a ground to the back gate of the pair of cross coupled p-type pull up transistors during a read operation. The charge stored on a pair of cross coupled storage nodes of the SRAM is coupled to a front gate and a back gate of a pair of cross coupled n-type pull down transistors in the SRAM during the write operation and during a read operation.

In one or more embodiments, the method includes applying the potential to a back gate of a pair of n-type pass transistors associated with opposite nodes of the SRAM during the write operation and applying the ground to a back gate of a pair of n-type pass transistors associated with opposite nodes of the SRAM during the read operation. In one or more embodiments applying the potential to the back gate of the pair of cross coupled p-type pull up transistors includes raising an absolute, e.g., magnitude change, threshold voltage (represented by "lVtl") of the pair of cross coupled p-type pull up transistors during the write operation. In one or more embodiments applying the potential to a back gate of a pair of n-type pass transistors includes lowering a threshold voltage (Vt) of the pair of n-type pass transistors during the write operation. Applying the ground potential to the back gate of the pair of cross coupled p-type pull up transistors during a read operation includes lowering a threshold voltage lVtl of the pair of cross coupled p-type pull up transistors. Applying the ground potential to the back gate of the pair of n-type pass transistors associated with opposite nodes of the SRAM during the read operation includes raising a threshold voltage (Vt) of the pair of n-type pass transistors.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1A:
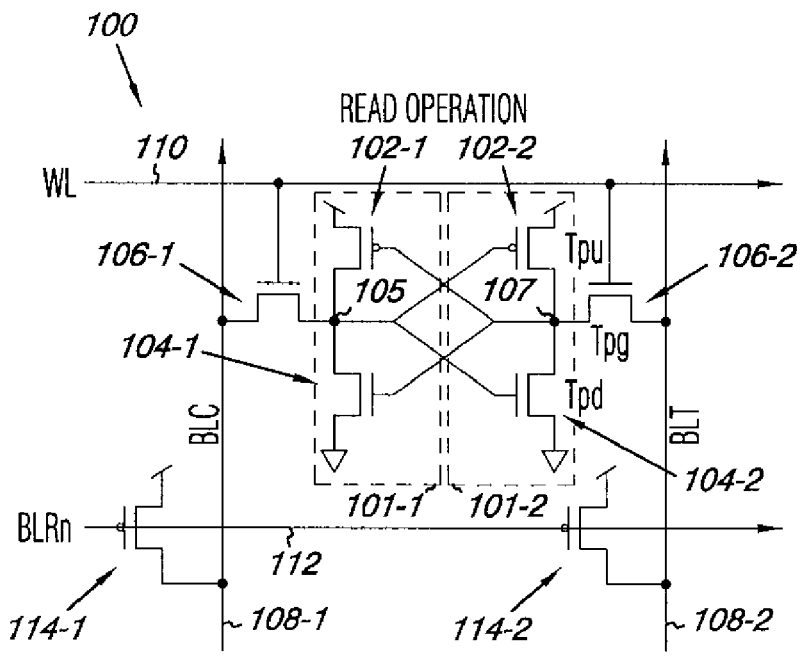
FIGS. 1A-1B illustrates a 6-T SRAM cell design according to the prior art.
Figure 1B:
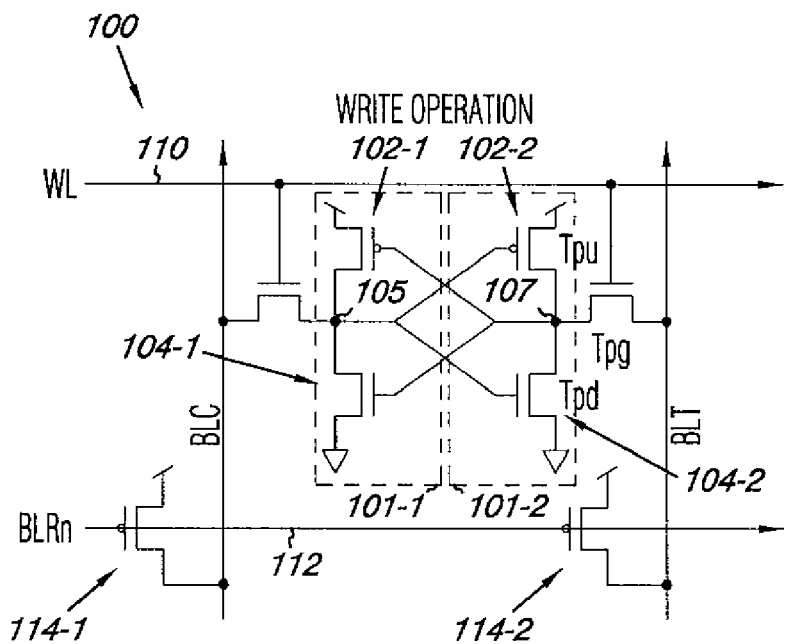

FIGS. 1A and 1B are useful for illustrating why MOSFET transistors with channel lengths longer than the particular node design rule have been employed in previous circuit designs for SRAM cells. FIG. 1A illustrates a 6-T SRAM cell design focused on achieving SRAM cell stability during the read operation. FIG. B illustrates a 6-T SRAM cell design focused on achieving SRAM cell stability during the write operation.

FIGS. 1A and 1B illustrate a 6-T SRAM cell 100. The SRAM cell 100 includes a first inverter 101-1 including a p-channel (PMOS) pull up transistor (Tpu) 102-1 and an n-channel (NMOS) pull down transistor (Tpd) 104-1 coupled at a first storage node 105, formed between their drain regions, to a drain region of an n-channel (NMOS) pass gate transistor (Tpg) 106-1. The source region of the Tpg 106-1 is coupled to a sense line 108-1, e.g., bit line, here referred to as bit line complement (BLC).

The SRAM cell 100 includes a second inverter 101-2 including a p-channel (PMOS) pull up transistor (Tpu) 102-2 and an n-channel (NMOS) pull down transistor (Tpd) 104-2 coupled at a second storage node 107, formed between their drain regions, to a drain region of an n-channel (NMOS) pass gate transistor (Tpg) 106-2. The source region of the Tpg 106-2 is coupled to another sense line 108-2, e.g., bit line, here referred to as bit line true (BLT). As shown in FIGS. 1A and 1B, the first and the second inverter, 101-1 and 101-2, are cross coupled such that the storage node 105 of the first inverter 101-1 is coupled to the gates of Tpu 102-2 and Tpd 104-2 and storage node 107 of the second inverter 101-2 is coupled to the gates of Tpu 102-1 and Tpd 104-1. Each inverter, 101-1 and 101-2, is coupled between a power supply node and ground. Hence, as the reader will appreciate, the cross coupled nature of the inverters, 101-1 and 101-2, is intended to function such that a charge stored on the first storage node 105 will be different to that stored on the second storage node 107.

The gates of the pass gate transistors, Tpg 106-1 and 106-2, are coupled to a select line 110, e.g., word line (WL). Operation on the first storage node 105 and the second storage node 107 is controlled via using the select line 110 to turn "on" the Tpgs, 106-1 and 106-2, and via the potential applied to BLC 108-1 and BLT 108-2. As shown in FIGS. 1A and 1B, BLC 108-1 and BLT 108-2 are accessed depending on the signal applied to a sense line, e.g., bit line, row enable line 112 (BLRn). The BLRn 112 can place an appropriate potential on BLC 108-1 and BLT 108-2 by activating respective transistors 114-1 and 114-2.

FIG. 1A is provided to illustrate a design rule in which the pass gate transistors, Tpg 106-1 and 106-2, to have a low drive current, e.g., high resistance in the linear operation region of the transistor, relative to a drive current of the transistors, Tpu 102-1, 102-2 and Tpd 104-1, 104-2, in the cross coupled inverters 101-1 and 101-2 in order to enhance stability for the read operation of the SRAM cell 100. In operation, to read a "state" on the second storage node 107, e.g., a charge representing a data state ("1" or a "0"), which is associated with BLT 108-2 in this example, both BLC 108-1 and BLT 108-2 may be pre-charged to some potential, e.g., Vcc/2. A potential is then applied to the select line 110, e.g. WL, in order to activate, e.g., turn "on", the pass gate transistors, Tpg 106-1 and 106-2, in order to read the SRAM cell 100. In the read operation it is desirable for the pass gate transistors, Tpg 106-1 and 106-2, to have a low drive current, e.g., high resistance in the linear operation region of the transistors, relative to a drive current of the transistors, Tpu 102-1, 102-2 and Tpd 104-1, 104-2, in the cross coupled inverters 101-1 and 101-2. As the reader will appreciate, this is to achieve a satisfactory, e.g., stable, discharge to the BLC 108-1 and BLT 108-2 without causing the cell to flip changing the information that used to exist between storage node 105 and 107 in order to ensure an accurate read. Hence, in the read operation it would be desirable for the pass gate transistors, Tpg 106-1 and 106-2, to be smaller devices with higher resistance in the linear operation region relative to the transistors, Tpu 102-1, 102-2 and Tpd 104-1, 104-2, in the cross coupled inverters 101-1 and 101-2.

FIG. 1B is provided to illustrate a design rule in which the pass gate transistors, Tpg 106-1 and 106-2, have a high drive current, e.g., low resistance in the linear operation region of the transistor, relative to a drive current of the transistors, Tpu 102-1, 102-2 and Tpd 104-1, 104-2, in the cross coupled inverters 101-1 and 101-2 in order to enhance stability for the write operation of the SRAM cell 100. As used in this example, the comparison of a drive current in one set of transistors being high or low relative to another set of transistors in the SRAM cell 100 comprises a difference in drive current between the two sets of transistors by at least a factor of two (2). In operation, to write a "state" on the second storage node 107, e.g., a charge representing a data state ("1" or a "0"), which is associated with BLT 108-2 in this example, BLC 108-1 can be grounded and BLT 108-2 may be charged to some elevated potential, e.g., Vcc. A potential is then applied to the select line 110, e.g. WL, in order to activate, e.g., turn "on", the pass gate transistors, Tpg 106-1 and 106-2, in order to write to the SRAM cell 100. In the write operation it is desirable for the pass gate transistors, Tpg 106-1 and 106-2, to have a high drive current, e.g., low resistance in the linear operation region of the transistors, relative to a drive current of the transistors, Tpu 102-1, 102-2 and Tpd 104-1, 104-2, in the cross coupled inverters 101-1 and 101-2. As the reader will appreciate, this is to achieve a satisfactory, e.g., stable, charge to the first and the second nodes 105 and 107 causing the SRAM cell 100 to flip writing a different state than that originally stored between storage node 105 and 107 in order to ensure an accurate write to the SRAM cell 100. Hence, in the write operation it would be desirable for the pass gate transistors, Tpg 106-1 and 106-2, to be larger devices, e.g., with lower resistance (R) in the linear operation region, relative to the transistors, Tpu 102-1, 102-2 and Tpd 104-1, 104-2, in the cross coupled inverters 101-1 and 101-2.

It is clear from the above example that a conflict between a cell design focused on read stability and a cell design focused on write stability exists. That is, as shown in the above example, a focus on stability in the read operation favors that the current drive ratios Tpd/Tpg and Tpu/Tpg are large, e.g., by a factor of two (2) or greater, while the ratios are small, e.g., by a factor of two (2) or greater, for a focus on stability in the write operation. As the reader will appreciate, the values of these ratios depend at least partially on the spread in transistor threshold voltage (Vt) which have to be more carefully distinguished as the transistor and gate length scale to smaller and smaller design rule node dimensions, e.g., 45 nanometer (nm) design rule node dimensions and smaller. Further, from a device fabrication standpoint it is more straightforward and less costly to fabricate the devices in the cell according to one compromised chosen design rule node dimension rather than forming one set of transistors according to one design rule node dimension and a second according to another.

As a result, the previous approach by cell designers as design rule node dimensions have scaled downward has been to purposefully maintain channel lengths according to a larger design rule node dimension, e.g., a 90 nm or above design rule node dimension, to strike a balance in stability between read and write operations. As the reader will appreciate, for devices with design rule node dimensions of 65 nm or above, e.g., devices having channel lengths of 90 nm or above, the threshold voltage (Vt) for the devices can be more accurately determined and account for process variations. For example, in previous 90 nm design rule node dimensions, possibly having 90 nm channel lengths, the process variations would be primarily manifest themselves in variations to channel length resulting in a variation in threshold voltages (Vt) between devices on the order of +/−30%. For a Vt of approximately 0.5 V this is not too large of a concern, e.g., a variation of +/−0.15 V. In design rule node dimensions of 45 nm and below, significantly more doping is employed with the devices with threshold voltages scaling toward 0.2 V. This results in a Vt variation of much greater than +/−30% due to doping fluctuations. To obtain Vt variations in the order of +/−30% in the 45 nm node SRAM designers use devices with channel lengths greater than 45 nm, e.g., 90 nm in length. Unfortunately, the above compromised approach of purposefully maintaining channel lengths according to a larger design rule node dimension, e.g., a 90 nm or above design rule node dimension, results in large cell and memory array areas which is costly in terms of device real estate.

Figure 4:
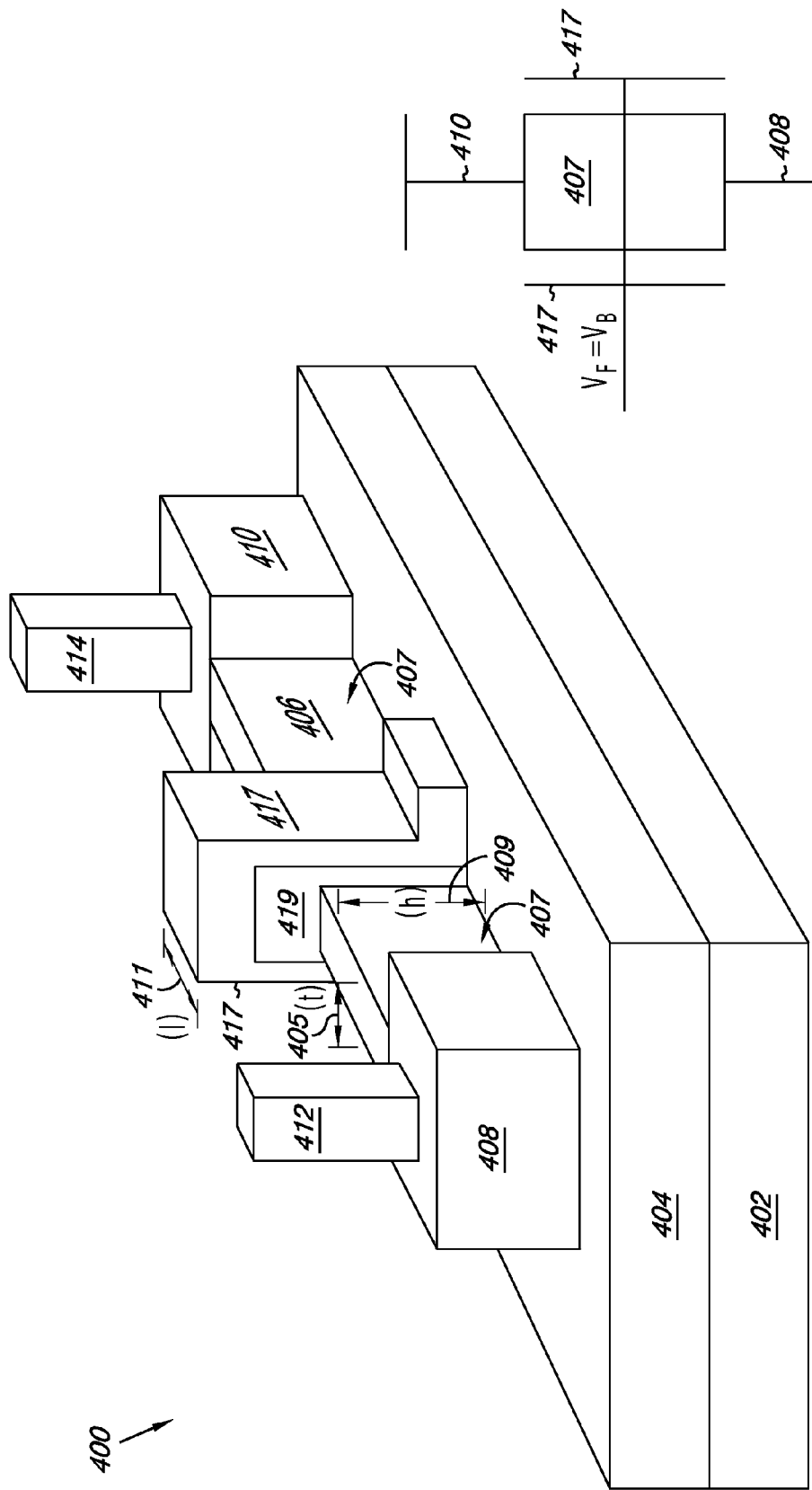
FIG. 4A illustrates another embodiment of a FinFET device implemented in an SRAM cell according to one or more embodiments of the present invention.
FIG. 4B is a schematic for the FinFET device shown in FIG. 4A.

To overcome the obstacles, one or more of the present embodiments involves using a "back-gated" and/or "double gated" Fin MOSFETs (FinFETs) as the transistor devices in an SRAM cell. FinFETs devices, e.g., as shown in FIGS. 2A and 4A, have been formed to 45 nm design rule node dimensions and below.

Figure 3:
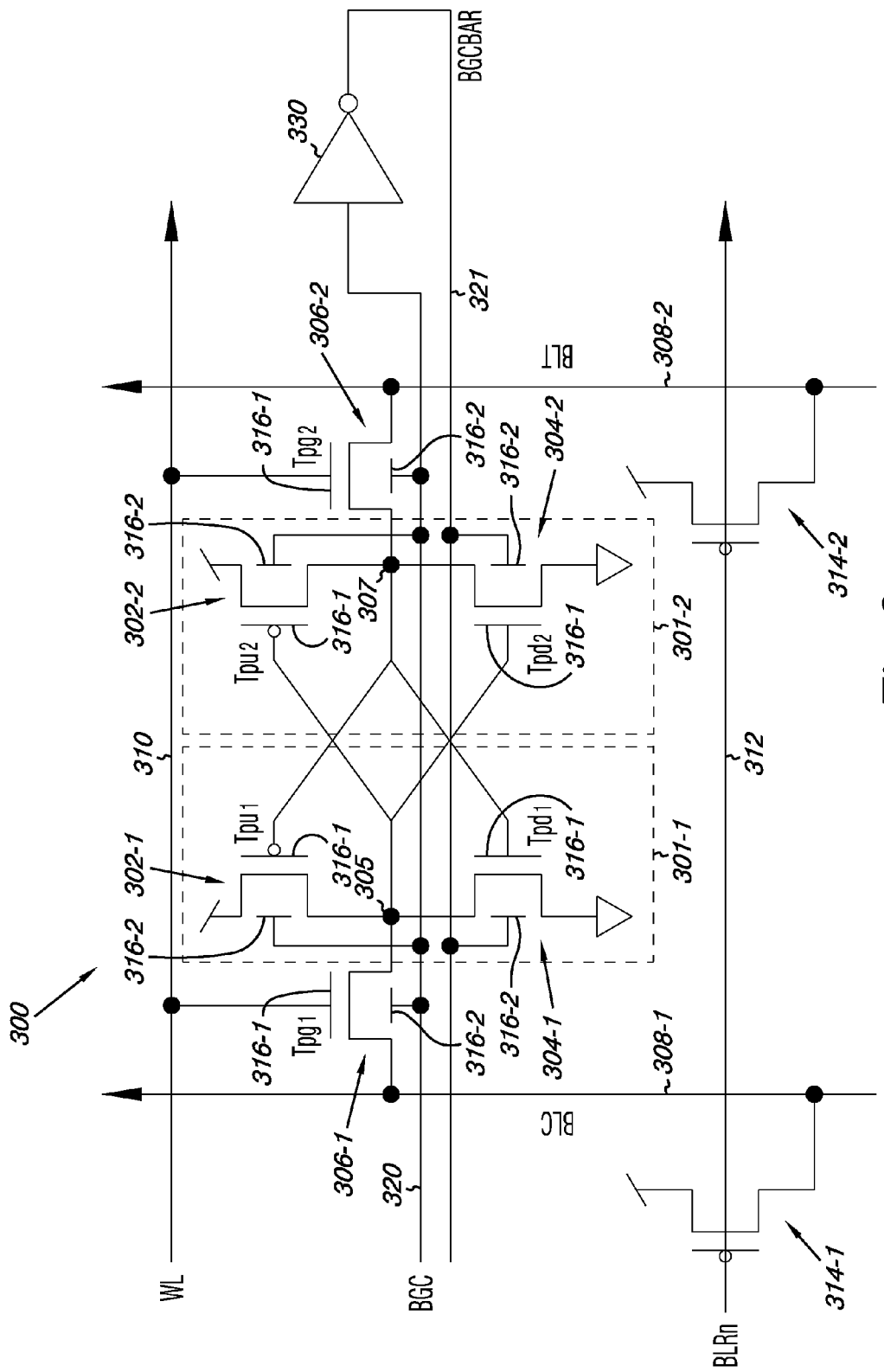
FIG. 3 illustrates an SRAM cell according to an embodiment of the present invention.
Figure 5:
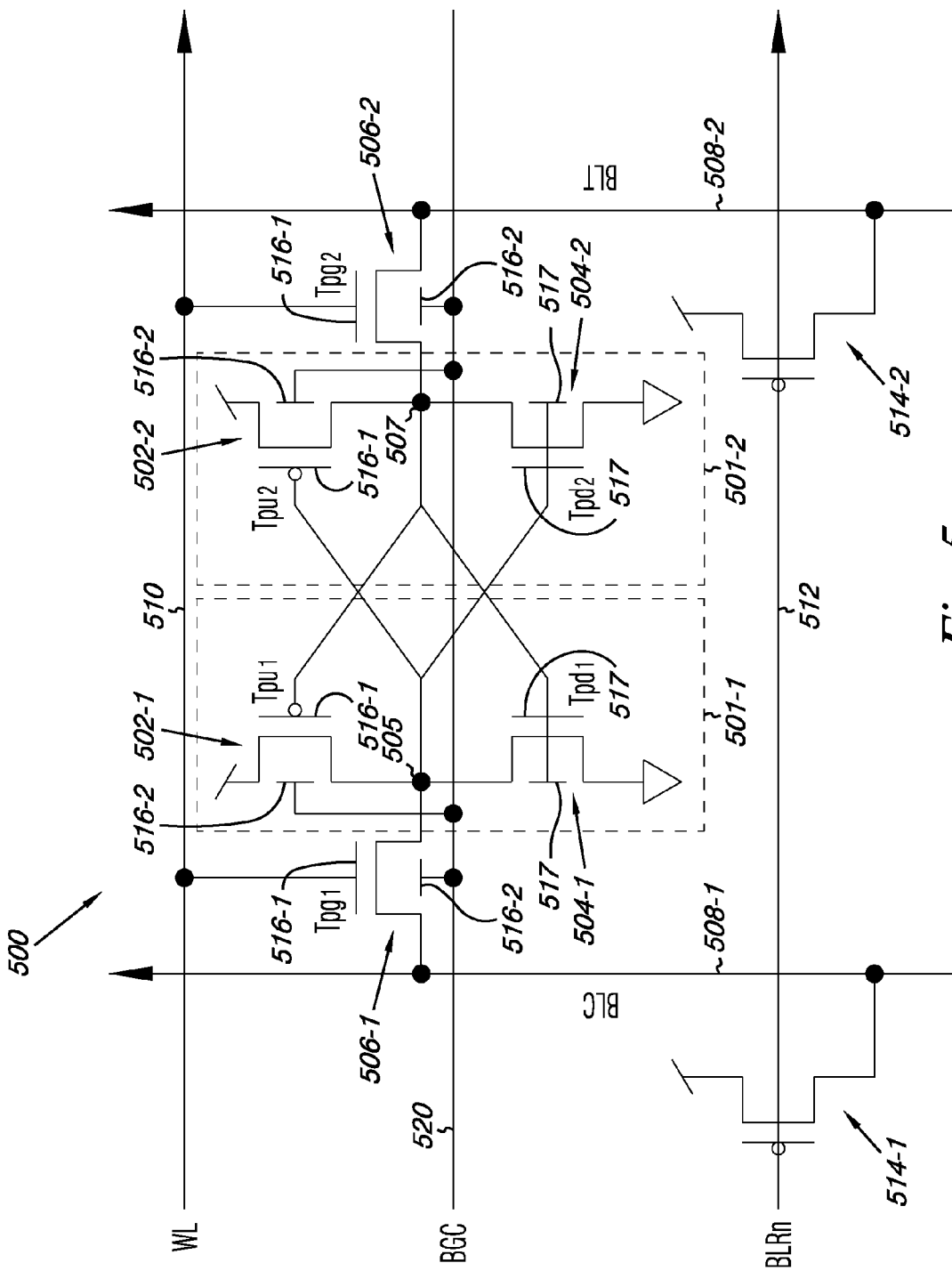
FIG. 5 illustrates an SRAM cell according to another embodiment of the present invention.

FIG. 2A illustrates perspective view of an embodiment of a back gated Fin MOSFET (FinFET) device 200 having separate front 216-1 and back 216-2 gates which can be implemented in an SRAM cell according to one or more embodiments of the present invention, e.g., FIGS. 3 and 5. FIG. 2A illustrates a back gated Fin MOSFET (FinFET) device as can be formed to a 45 nm design rule node dimension or smaller. In the embodiment of FIG. 2A, the FinFET device 200 is separated by an insulator layer 204, e.g., a base oxide (BOX), from a substrate 202, e.g. a bulk silicon wafer. As the reader will appreciate, the FinFET device 200 can be configured either as a p-type FinFET device or as an n-type FinFET device depending on choice of doping.

As shown in FIG. 2A, the FinFET device, also includes a source 208 and a drain 210 structure (note that between source 208 and drain 210 and the gates 216-1 and 216-2 source/drain extensions (SDEs) will exist in the region 206) such that current will flow in the sidewalls 207 of the Fin 206 between the source 208 and the drain 210 when the FinFET device 200 is "on". One example of the formation of a FinFET device 200 is provided in copending, commonly assigned, U.S. patent application Ser. No. 11/851,993, entitled "FIN Field Effect Transistor", by the same inventor, filed on Sep. 7, 2007.

In operation, the current flow in the FinFET device is between the source 208 and the drain 210. As shown in FIG. 2A, a source contact 212 is provided to the source 208 and a drain contact 214 is provided to the drain 210 such that a potential can be established between the source 208 and the drain 210. The embodiment of the FinFET device 200 in FIG. 2A also illustrates the separation of a first gate 216-1, e.g., front gate, and second gate 216-2, e.g., back gate, on opposing the sidewalls 207 of the body region of the Fin 206 which serve as the channels underneath the gates 216-1 and 216-2 of the device 200. The gates 216-1 and 216-2 are separated from the body region of the Fin 206 which serve as the channels by a dielectric 219.

As the reader will appreciate, a thickness (t) 205 of the Fin 206 is sufficiently thin, e.g., approximately 20 nanometers (nm) or less, such that applying a potential to the second, e.g., back, gate 216-2, will impact a threshold voltage (Vt) for creating a conduction channel between the source 208 and the drain in the sidewall 207 opposing the first, e.g., front gate 216-1. That is, the Vt associated with a gate, e.g., 216-1, opposing a sidewall 207 on one side of body region to the Fin 206 depends on the potential applied to a gate, e.g., 216-2, opposing a sidewall 207 on the other side of the body region to the Fin 206.

As shown in the schematic of FIG. 2B, a threshold voltage (Vt) necessary to create a channel beneath the first, e.g., front, gate 216-1 between the source region 208 and the drain region 210 along the sidewall 207 of the body region of the Fin 206 opposing the first gate 216-1 is dependent on the potential applied to the second, e.g., back, gate 216-2 on the other side of the body region of the Fin 206 opposing the other sidewall 207 of the Fin 206. Hence, in contrast to independent transistor devices formed on opposite sides of a structure, the threshold voltage Vt of the first gate 216-1 of the structure 200 is not independent of the second gate 216-2 as it would be for two separate/independent transistors.

Although a separate front and back gates 216-1 and 216-2 are shown opposing the sidewalls 207 of the body region of the Fin 206 of the FinFET device 200 shown in FIG. 2A, one or more embodiments, as will be described in connection with FIG. 4A, can include a single gate 216 coupled to both opposing sidewalls 207 of the body region of the Fin 206.

FIG. 3 illustrates an SRAM cell 300 according to an embodiment of the present invention. FIG. 3 illustrates a six transistor (6-T) SRAM cell 300. However, one of ordinary skill in the art will appreciate that the concepts described herein can be implemented in other cell configurations. That is, the embodiments described herein are not limited to a 6-T SRAM cell. In the embodiment of FIG. 3, each of the six transistors includes a dual gated Fin MOSFET structure, e.g., such as MOS FinFET 200 shown in FIG. 2A, having a first gate 316-1, e.g., front gate 216-1 shown in FIG. 2A, and a second gate 316-2, e.g., back gate 216-2 as shown in FIG. 2A.

The SRAM cell 300 includes a first inverter 301-1 including a p-channel FinFET (PMOS FinFET) pull up transistor (Tpu) 302-1, e.g., having a structure such as shown in FIG. 2A, and an n-channel FinFET (NMOS FinFET) pull down transistor (Tpd) 304-1, e.g., having a structure such as shown in FIG. 2A, coupled at a first storage node 305, formed between their drain regions, to a drain region of an n-channel FinFET (NMOS FinFET) pass gate transistor (Tpg) 306-1, e.g., having a structure such as shown in FIG. 2A. The source region of the Tpg 306-1 is coupled to a sense line 308-1, e.g., bit line, here referred to as bit line common (BLC).

The SRAM cell 300 includes a second inverter 301-2 including a p-channel FinFET (PMOS FinFET) pull up transistor (Tpu) 302-2, e.g., having a structure such as shown in FIG. 2A, and an n-channel FinFET (NMOS FinFET) pull down transistor (Tpd) 304-2, e.g., having a structure such as shown in FIG. 2A, coupled at a second storage node 307, formed between their drain regions, to a drain region of an n-channel FinFET (NMOS FinFET) pass gate transistor (Tpg) 306-2. The source region of the Tpg 306-2 is coupled to another sense line 308-2, e.g., bit line, here referred to as bit line true (BLT). As shown in FIG. 3, the first and the second inverter, 301-1 and 301-2, are cross coupled such that the storage node 305 of the first inverter 301-1 is coupled to a first gates 316-1, e.g., front gate 216-1 in FIG. 2A, of Tpu 302-2 and Tpd 304-2 and storage node 307 of the second inverter 301-2 is coupled to the first gates 316-1, e.g., front gate 216-1 in FIG. 2A, of Tpu 302-1 and Tpd 304-1. As used herein, reference to first storage node and second node storage node may be interchanged, e.g., storage node 305 of the first inverter 301-1 referred to as "second" storage node and storage node 307 of the second inverter 301-2 referred to as "first" storage node. Each inverter, 301-1 and 301-2, is coupled between a power supply node and ground. Hence, as the reader will appreciate, the cross coupled nature of the inverters, 301-1 and 301-2, is intended to function such that a charge stored on the first storage node 305 will be different to that stored on the second storage node 307.

The first gates 316-1 of the pass gate transistors, Tpg 306-1 and 306-2, are coupled to a select line 310, e.g., word line (WL). Operation on the first storage node 305 and the second storage node 307 is controlled via using the select line 310 to turn "on" the Tpgs, 306-1 and 306-2, and via the potential applied to BLC 308-1 and BLT 308-2. As shown in FIG. 3, BLC 308-1 and BLT 308-2 are accessed depending on the signal applied to a sense line, e.g., bit line, row enable line 312 (BLRn). The BLRn 312 can place an appropriate potential on BLC 308-1 and BLT 308-2 by activating respective transistors 314-1 and 314-2.

In operation, to read a "state" on the second storage node 307, e.g., a charge representing a data state ("1" or a "0"), which is associated with BLT 308-2 in this example, both BLC 308-1 and BLT 308-2 may be pre-charged to some potential, e.g., Vcc/2. A potential, e.g., a boosted Vcc, is then applied to the select line 310, e.g. WL, in order to activate, e.g., turn "on", the pass gate transistors, Tpg 306-1 and 306-2, in order to read the SRAM cell 300. In the read operation it is desirable for the pass gate transistors, Tpg 306-1 and 306-2, to have a low drive current, e.g., high resistance in the linear operation region of the transistors, relative to a drive current of the transistors, Tpu 302-1, 302-2 and Tpd 304-1, 304-2, in the cross coupled inverters 301-1 and 301-2. As the reader will appreciate, this is to achieve a satisfactory, e.g., stable, discharge to the BLC 308-1 and BLT 308-2 without causing the cell to flip changing the information that used to exist between storage node 305 and 307 in order to ensure an accurate read. Hence, in the read operation a back gate control line 320 is coupled to the second gates 316-2 of the pass gate transistors, Tpg 306-1 and 306-2, to provide a lower drive current and higher resistance in the linear operation region relative to the transistors, Tpu 302-1, 302-2 and Tpd 304-1, 304-2, in the cross coupled inverters 301-1 and 301-2. That is, a 0.0V, e.g., second potential or ground potential, is applied to a back gate 316-2 of a pair of n-type pass transistors, Tpg 306-1 and 306-2, associated with opposite nodes of the SRAM during the read operation effectively raises a threshold voltage (Vt) of the pair of n-type pass transistors, Tpg 306-1 and 306-2. In one or more embodiments, the back gate control line (BGC) can also be coupled to the back gates 316-2 of the pair of Tpus, 302-1 and 302-2.

Figure 6:
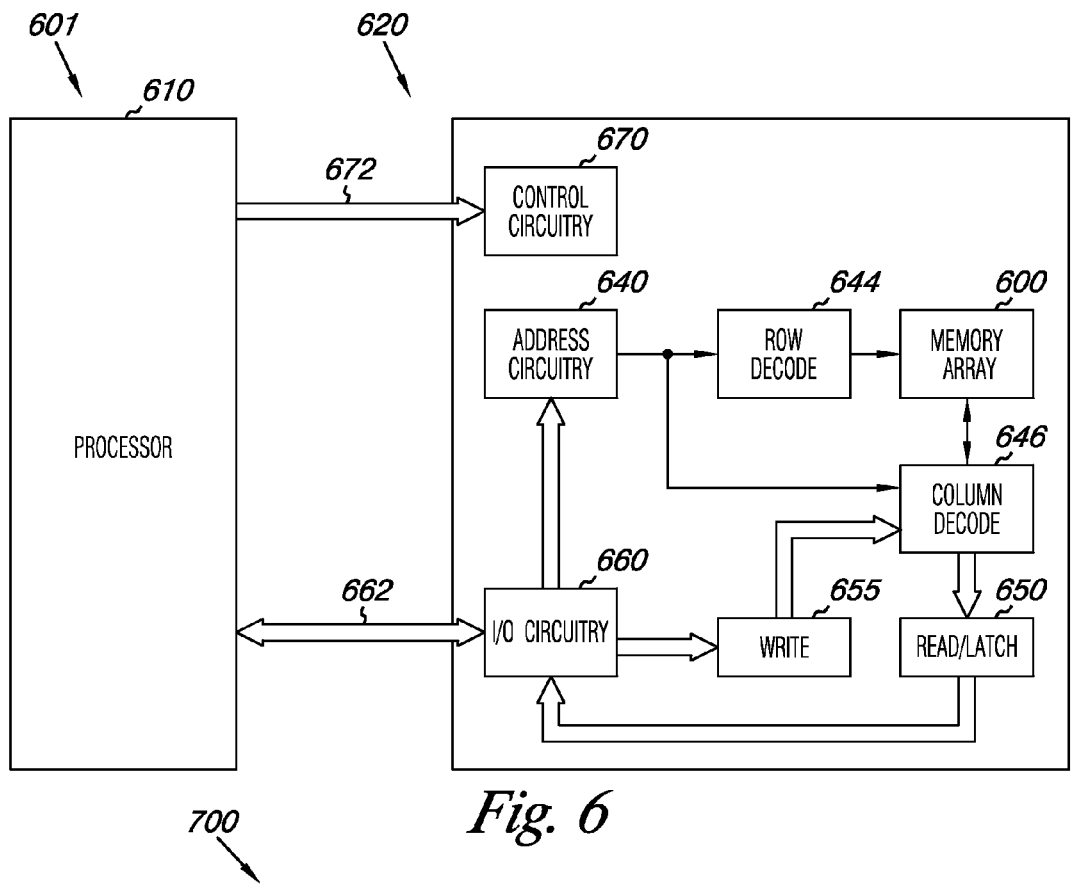
FIG. 6 is a functional block diagram of an electronic memory system having at least one memory device in accordance with an embodiment of the present disclosure.

FIG. 3 thus illustrates an operational scenario in which the back gate control line, controlled by control circuitry, e.g., 670 in FIG. 6, causes the pass gate transistors, Tpg 306-1 and 306-2, to have a low drive current, e.g., high resistance in the linear operation region of the transistor, relative to a drive current of the transistors Tpu 302-1 and 302-2 during the read operation. That is, as one of ordinary skill in the art will appreciate, applying the second potential, e.g, a ground potential, to the back gate of the pair of n-type pass transistors, Tpg 306-1 and 306-2, raises a threshold voltage (Vt) of the pair of n-type pass transistors, Tpg 306-1 and 306-2. In one or more embodiments, the back gate control line (BGC) can also be coupled to the back gates 316-2 of the pair of Tpus, 302-1 and 302-2 such that applying the second potential, e.g., ground potential, to the back gate of the transistors Tpu 302-1 and 302-2 during the read operation lowers a threshold voltage |Vt| of the pair of transistors Tpu 302-1 and 302-2 during the read operation in order to enhance stability for the read operation of the SRAM cell 300.

In the embodiment shown in FIG. 3, the back gate control line potential is inverted, e.g., using inverter 330, and the inverted signal, e.g., BGCBAR, coupled to a back gate, e.g., 316-2, of the Tpds, 304-1 and 304-2 in order to lower a threshold voltage (Vt) of the Tpds, 304-1 and 304-2 during the read operation.

In operation, to write a "state" on the second storage node 307, e.g., a charge representing a data state ("1" or a "0"), which is associated with BLT 308-2 in this example, BLC 308-1 can be grounded and BLT 308-2 may be charged to some elevated potential, e.g., Vcc. A potential is then applied to the select line 310, e.g. WL, in order to active, e.g., turn "on", the pass gate transistors, Tpg 306-1 and 306-2, in order to write the SRAM cell 300. In the write operation it is desirable for the pass gate transistors, Tpg 306-1 and 306-2, to have a high drive current, e.g., low resistance in the linear operation region of the transistors, relative to a drive current of the transistors, Tpu 302-1, 302-2 and Tpd 304-1, 304-2, in the cross coupled inverters 301-1 and 301-2. As the reader will appreciate, this is to achieve a satisfactory, e.g., stable, charge to the BLC 308-1 and BLT 308-2 causing the SRAM cell 300 to flip, thus writing a different state than that originally stored between storage node 305 and 307 in order to ensure an accurate write to the SRAM cell 300. Hence, in the write operation a back gate control line 320 is coupled to the second gates 316-2 of the pass gate transistors, Tpg 306-1 and 306-2, to provide a high drive current and lower resistance in the linear operation region relative to the transistors, Tpu 302-1, 302-2 and Tpd 304-1, 304-2, in the cross coupled inverters 301-1 and 301-2. That is, a first potential, e.g., a boosted Vcc, is applied to a back gate 316-2 of a pair of n-type pass transistors, Tpg 306-1 and 306-2, associated with opposite nodes of the SRAM during the read operation effectively lowering a threshold voltage (Vt) of the pair of n-type pass transistors, Tpg 306-1 and 306-2. In one or more embodiments, the back gate control line (BGC) can also be couple to the back gates 316-2 of the pair of Tpus, 302-1 and 302-2.

FIG. 3 thus illustrates an operational scenario in which the back gate control line, controlled by control circuitry, e.g., 670 in FIG. 6, causes the pass gate transistors, Tpg 306-1 and 306-2, to have a high drive current, e.g., low resistance in the linear operation region of the transistor, relative to a drive current of the transistors Tpus 302-1 and 302-2 during the write operation. That is, as one of ordinary skill in the art will appreciate, applying a first potential, e.g., a boosted Vcc, to the back gate of the pair of n-type pass transistors, Tpg 306-1 and 306-2, lowers threshold voltage (Vt) of the pair of n-type pass transistors, Tpg 306-1 and 306-2. In one or more embodiments, the back gate control line (BGC) can also be coupled to the back gates 316-2 of the pair of Tpus, 302-1 and 302-2 such that applying the first potential, e.g., a boosted Vcc, to the back gate of the transistors Tpu 302-1 and 302-2 during the write operation raises a threshold voltage |Vt| of the pair of transistors Tpu 302-1 and 302-2 during the write operation in order to enhance stability for the write operation of the SRAM cell 300.

In the embodiment shown in FIG. 3, the back gate control line potential is inverted, e.g., using inverter 330, and the inverted signal, e.g., BGCBAR, coupled to a back gate, e.g., 316-2, of the Tpds, 304-1 and 304-2 in order to raise a threshold voltage |Vt| of the Tpds, 304-1 and 304-2 during the write operation. As used in this example, the comparison of a drive current in one set of transistors being high or low relative to another set of transistors in the SRAM cell 300 comprises a different in drive current between the two sets of transistors by at least a factor of two (2).

FIG. 4A illustrates perspective view of an embodiment of a dual gated Fin MOSFET (FinFET) device 400 having a single gate 417 which can be implemented in an SRAM cell according to one or more embodiments of the present invention, e.g., FIGS. 3 and 5. FIG. 4A illustrates a dual gated Fin MOSFET (FinFET) device as can be formed to a 45 nm design rule node dimension or smaller. In the embodiment of FIG. 4A, the FinFET device 400 can be separated by an insulator layer 404, e.g., a base oxide (BOX), from a substrate 402, e.g. a bulk silicon wafer. As the reader will appreciate, the FinFET device 400 can be configured either as a p-type FinFET device or as an n-type FinFET device depending on choice of doping.

As shown in FIG. 4A, the FinFET device, also includes a source 408 and a drain 410 structure (note that between source 408 and drain 410 and the gate 417 source/drain extensions (SDEs) will exist, in the region 406) such that current will flow in the sidewalls 407 of the Fin 406 between the source 408 and the drain 410 when the FinFET device 400 is "on". One example of the formation of a FinFET device 400 is provided in copending, commonly assigned, U.S. patent application Ser. No. 11/851,993, entitled "FIN Field Effect Transistor", by the same inventor, filed on Sep. 7, 2007.

In operation, the current flow in the FinFET device is between the source 408 and the drain 410. As shown in FIG. 4A, a source contact 412 is provided to the source 408 and a drain contact 414 is provided to the drain 410 such that a potential can be established between the source 408 and the drain 410. The embodiment of FIG. 4A also illustrates the separation of the gate 417 on opposing the sidewalls 407 of the body region of the Fin 406 which serve as the channels underneath the gate 417 of the device 400. The gate 417 is separated from the body region of the Fin 406 which serve as the channels by a dielectric 419.

As the reader will appreciate, a thickness (t) 405 of the Fin 406 is sufficiently thin, e.g., approximately 20 nanometers (nm) or less, such that applying a potential to the gate 417, e.g., gate opposing both sidewalls 407 of a body region of the Fin 406, serving as conduction channels beneath the gate 417 between the source 408 and the drain 410 will impact a threshold voltage (Vt) for creating a conduction channel between the source 408 and the drain in the sidewalls 407 opposing the gates 417. That is, the Vt associated with a portion of the gate 417 opposing a sidewall 407 on one side of body region to the Fin 406 depends on the same potential applied to the gate 417 opposing a sidewall 407 on the other side of the body region to the Fin 406.

As shown in the schematic of FIG. 4B, a threshold voltage (Vt) necessary to create a channel beneath the gate 417 between the source region 408 and the drain region 410 along the sidewalls 407 of the body region of the Fin 406 opposing the gate 417 is dependent on the potential applied to the gate 417 on the other side of the body region of the Fin 406 opposing the other sidewall 407 of the Fin 406. Hence, in contrast to independent transistor devices formed on opposite sides of a structure, the single gate structure 417 is serving as front and back gates is biased together to switch the FinFET device 400 on/off.

FIG. 5 illustrates an SRAM cell 500 according to another embodiment of the present invention. In the embodiment of FIG. 5, the double gate FinFET structure shown in FIG. 4A is implemented as the Tpds transistors 504-1 and 504-2. The SRAM cell 500 includes a first inverter 501-1 including a p-channel FinFET (PMOS FinFET) pull up transistor (Tpu) 502-1, e.g., having a FinFET structures such as shown in FIG. 2A, and an n-channel FinFET (NMOS FinFET) pull down transistor (Tpd) 504-1, e.g., having a FinFET structure such as shown in FIG. 4A, coupled at a first storage node 505, formed between their drain regions, to a drain region of an n-channel FinFET (NMOS FinFET) pass gate transistor (Tpg) 506-1, e.g., having a structure such as shown in FIG. 2A. The source region of the Tpg 506-1 is coupled to a sense line 508-1, e.g., bit line, here referred to as bit line common (BLC).

The SRAM cell 500 includes a second inverter 501-2 including a p-channel FinFET (PMOS FinFET) pull up transistor (Tpu) 502-2, e.g., having a structure such as shown in FIG. 2A, and an n-channel FinFET (NMOS FinFET) pull down transistor (Tpd) 504-2, e.g., having a structure such as shown in FIG. 4A, coupled at a second storage node 507, formed between their drain regions, to a drain region of an n-channel FinFET (NMOS FinFET) pass gate transistor (Tpg) 506-2. The source region of the Tpg 506-2 is coupled to another sense line 508-2, e.g., bit line, here referred to as bit line true (BLT). As shown in FIG. 5, the first and the second inverter, 501-1 and 501-2, are cross coupled such that the storage node 505 of the first inverter 501-1 is coupled to a first gates 516-1, e.g., front gate 216-1 in FIG. 2A, of Tpu 502-2 and the single gate 517, e.g., coupled together single front and back gate 517 in FIG. 4A, of Tpd 504-2. Storage node 507 of the second inverter 501-2 is coupled to the first gates 516-1, e.g., front gate 216-1 in FIG. 2A, of Tpu 502-1 and the single gate 517, e.g., coupled together single front and back gate 517 in FIG. 4A, of Tpd 504-1. Each inverter, 501-1 and 501-2, is coupled between a power supply node and ground. Hence, as the reader will appreciate, the cross coupled nature of the inverters, 501-1 and 501-2, is intended to function such that a charge stored on the first storage node 505 will be different to that stored on the second storage node 507.

The first gates 516-1 of the pass gate transistors, Tpg 506-1 and 506-2, are coupled to a select line 510, e.g., word line (WL). Operation on the first storage node 505 and the second storage node 507 is controlled via using the select line 510 to turn "on" the Tpgs, 506-1 and 506-2, and via the potential applied to BLC 508-1 and BLT 508-2. As shown in FIG. 5, BLC 508-1 and BLT 508-2 are accessed depending on the signal applied to a sense line, e.g., bit line, row enable line 512 (BLRn). The BLRn 512 can place an appropriate potential on BLC 508-1 and BLT 508-2 by activating respective transistors 514-1 and 514-2.

In operation, to read a "state" on the second storage node 507, e.g., a charge representing a data state ("1" or a "0"), which is associated with BLT 508-2 in this example, both BLC 508-1 and BLT 508-2 may be pre-charged to some potential, e.g., Vcc/2. A potential is then applied to the select line 510, e.g. WL, in order to activate, e.g., turn "on", the pass gate transistors, Tpg 506-1 and 506-2, in order to read the SRAM cell 300. In the read operation it is desirable for the pass gate transistors, Tpg 506-1 and 506-2, to have a low drive current, e.g., high resistance in the linear operation region of the transistors, relative to a drive current of the transistors, Tpu 502-1, 502-2 and Tpd 504-1, 504-2, in the cross coupled inverters 501-1 and 501-2. As the reader will appreciate, this is to achieve an improved, e.g., more stable at smaller node design rules, discharge to the BLC 508-1 and BLT 508-2 without causing the cell to flip changing the information that used to exist between storage node 505 and 507 in order to ensure an accurate read. Further, this is achieved without incurring a penalty in area over the previous approaches to SRAM cell design or planar cell layout due to the use of back-gate and double gate FinFET devices.

Hence, in the read operation a back gate control line 520 is coupled to the second gates 516-2 of the pass gate transistors, Tpg 506-1 and 506-2, to provide a lower drive current and higher resistance in the linear operation region relative to the transistors, Tpu 502-1, 502-2 and Tpd 504-1, 504-2, in the cross coupled inverters 501-1 and 501-2. That is, a 0.0 V, e.g., ground potential, is applied to a back gate 516-2 of a pair of n-type pass transistors, Tpg 506-1 and 506-2, associated with opposite nodes 505 and 507 of the SRAM during the read operation to effectively raise a threshold voltage (Vt) of the pair of n-type pass transistors, Tpg 506-1 and 506-2. In one or more embodiments, the back gate control line (BGC) is also coupled to the back gates 516-2 of the pair of Tpus, 502-1 and 502-2.

FIG. 5 thus illustrates an operational scenario in which the back gate control line, controlled by control circuitry, e.g., 670 in FIG. 6, causes the pass gate transistors, Tpg 506-1 and 506-2, to have a low drive current, e.g., high resistance in the linear operation region of the transistor, relative to a drive current of the transistors Tpu 502-1 and 502-2 during the read operation. That is, as one of ordinary skill in the art will appreciate, applying a ground potential to the back gate of the pair of n-type pass transistors, Tpg 506-1 and 506-2, raises a threshold voltage (Vt) of the pair of n-type pass transistors, Tpg 506-1 and 506-2. In one or more embodiments, the back gate control line (BGC) is also coupled to the back gates 516-2 of the pair of Tpus, 502-1 and 502-2 such that applying the ground to the back gate of the transistors Tpu 502-1 and 502-2 during the read operation lowers a threshold voltage |Vt| and increases the drive current of the pair of transistors Tpu 502-1 and 502-2 during the read operation in order to enhance stability for the read operation of the SRAM cell 500.

In operation, to write a "state" on the second storage node 507, e.g., a charge representing a data state ("1" or a "0"), which is associated with BLT 508-2 in this example, BLC 508-1 can be grounded and BLT 508-2 may be charged to some elevated potential, e.g., Vcc. A potential is then applied to the select line 510, e.g. WL, in order to active, e.g., turn "on", the pass gate transistors, Tpg 506-1 and 506-2, in order to write the SRAM cell 500. In the write operation it is desirable for the pass gate transistors, Tpg 506-1 and 506-2, to have a high drive current, e.g., low resistance in the linear operation region of the transistors, relative to a drive current of the transistors, Tpu 502-1, 502-2 and Tpd 504-1, 504-2, in the cross coupled inverters 501-1 and 501-2. As the reader will appreciate, this is to improve, e.g., make more stable, a charge to the BLC 508-1 and BLT 508-2 causing the SRAM cell 500 to flip writing a different state than that originally stored between storage node 505 and 507 in order to ensure an accurate write to the SRAM cell 500.

Hence, in the write operation a back gate control line 520 is coupled to the second gates 516-2 of the pass gate transistors, Tpg 506-1 and 506-2, to provide a high drive current and lower resistance in the linear operation region relative to the transistors, Tpu 502-1, 502-2 and Tpd 504-1, 504-2, in the cross coupled inverters 501-1 and 501-2. That is, a potential, e.g., 1.2 V, is applied to a back gate 516-2 of a pair of n-type pass transistors, Tpg 506-1 and 506-2, associated with opposite nodes of the SRAM during the read operation to effectively lower a threshold voltage (Vt) of the pair of n-type pass transistors, Tpg 506-1 and 506-2. In one or more embodiments, the back gate control line (BGC) can also be couple to the back gates 316-2 of the pair of Tpus, 502-1 and 502-2.

FIG. 5 thus illustrates an operational scenario in which the back gate control line, controlled by control circuitry, e.g., 670 in FIG. 6, causes the pass gate transistors, Tpg 506-1 and 506-2, to have a high drive current, e.g., low resistance in the linear operation region of the transistor, relative to a drive current of the transistors Tpus 502-1 and 502-2 during the write operation. That is, as one of ordinary skill in the art will appreciate, applying a potential, e.g., a boosted Vcc, to the back gate of the pair of n-type pass transistors, Tpg 506-1 and 506-2, lowers a threshold voltage (Vt) of the pair of n-type pass transistors, Tpg 506-1 and 506-2. In one or more embodiments, the back gate control line (BGC) can also be coupled to the back gates 516-2 of the pair of Tpus, 502-1 and 502-2 such that applying the potential, e.g., a boosted Vcc, to the back gate of the transistors Tpu 502-1 and 502-2 during the write operation raises a threshold voltage |Vt| and lowers the drive current of the pair of transistors Tpu 502-1 and 502-2 during the write operation in order to enhance stability for the write operation of the SRAM cell 500.

As mentioned above, Storage node 505 of the first inverter 501-1 is coupled to the single front and back gate 517, of Tpd 504-2 and storage node 507 of the second inverter 501-2 is coupled to the single front and back gate 517 of Tpd 504-1 in order to raise a threshold voltage (Vt) of the Tpds, 504-1 and 504-2 during the write operation. As used in this example, the comparison of a drive current in one set of transistors being high or low relative to another set of transistors in the SRAM cell 500 comprises a different in drive current between the two sets of transistors by at least a factor of two (2).

Hence, in the embodiment of FIG. 5, Tpg 506-1 and 506-2 and Tpu 502-1, 502-2 are operated in a "back-gate" mode, e.g., biased independently, with the first gates 516-1 used to switch the FinFETs on/off and the second gates 516-2 used to adjust the threshold voltage (Vt). Tpds 504-1 and 504-2 are operated in a "double-gate" mode, e.g., the coupled together single front and back gate 517, of Tpds 504-1 and 504-2 are biased together to switch the FinFETs on/off. According to one or more embodiments described herein, back-gate and/or double-gate biasing during the read/write operations of a SRAM cell having FinFET devices is effective for dynamic control of Vt with transistor design rule scaling and can provide improved control of short channel effects as well. The back-gate and/or double-gate biasing during the read/write operations of a SRAM cell having FinFET devices according to one or more of the embodiments described herein can thus be leveraged to provide dynamic adjustments to the current drive ratios Tpd/Tpg and Tpu/Tpg to afford improved read and write stability with transistor design rule scaling.

FIG. 6 is a functional block diagram of an electronic memory system 601 including at least one memory device 620 having a back gated SRAM cell in accordance with an embodiment of the present disclosure. Memory system 601 includes a processor 610 coupled to a memory device 620 that includes a memory array 600 of memory cells. The memory device 620 can include an array 600 of back gated SRAM cells which can be formed and operated according to one or more embodiments described herein.

The memory system 601 can include separate integrated circuits or both the processor 610 and the memory device 620 can be on the same integrated circuit. The processor 610 can be a microprocessor or some other type of controlling circuitry such as an application-specific integrated circuit (ASIC).

The embodiment of FIG. 6 includes address circuitry 640 to latch address signals provided over I/O connections 662 through I/O circuitry 660. Address signals are received and decoded by a row decoder 644 and a column decoder 646 to access the memory array 600. In light of the present disclosure, it will be appreciated by those skilled in the art that the number of address input connections depends on the density and architecture of the memory array 600 and that the number of addresses increases with both increased numbers of memory cells and increased numbers of memory blocks and arrays.

The memory device 620 reads data in the memory array 600 by sensing voltage and/or current changes in the memory array columns using sense/buffer circuitry that in this embodiment can be read/latch circuitry 650. The read/latch circuitry 650 can read and latch a page or row of data from the memory array 600. I/O circuitry 660 is included for bi-directional data communication over the I/O connections 662 with the processor 610. Write circuitry 655 is included to write data to the memory array 600.

Control circuitry 670 decodes signals provided by control connections 672 from the processor 610. These signals can include chip signals, write enable signals, and address latch signals that are used to control the operations on the memory array 600, including data read, data write, and data erase operations. In one or more embodiments, the control circuitry 670 is responsible for executing instructions from the processor 610 to perform the operating embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
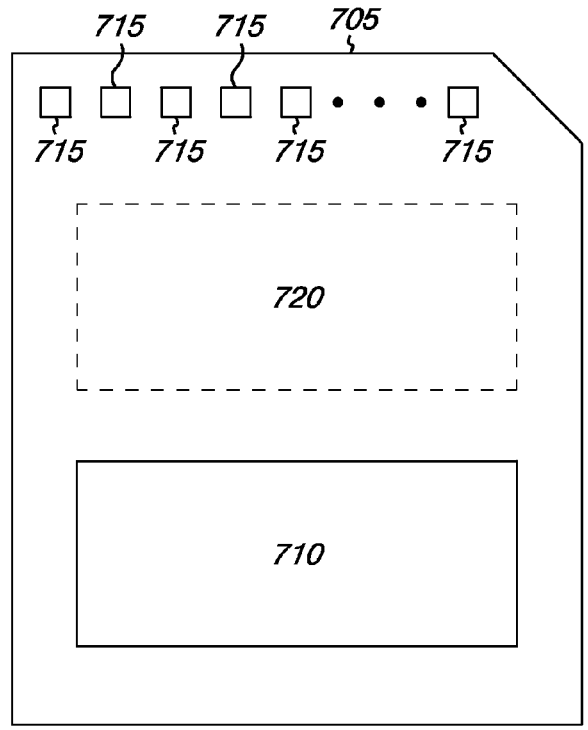
FIG. 7 is a functional block diagram of a memory module having at least one memory device in accordance with an embodiment of the present disclosure.

FIG. 7 is a functional block diagram of a memory module 700 including at least one back gated SRAM cell in accordance with one or more embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In one or more embodiments, memory module 700 will include a housing 705 (as depicted) to enclose one or more memory devices 710, though such a housing is not essential to all devices or device applications. At least one memory device 710 includes a back gated SRAM cell that can be operated according to one or more embodiments described herein. Where present, the housing 705 includes one or more contacts 715 for communication with a host device. Examples of host devices include digital cameras, digital recording and playback devices, PDAs, personal computers, memory card readers, interface hubs and the like. For one or more embodiments, the contacts 715 are in the form of a standardized interface. For example, with a USB flash drive, the contacts 715 might be in the form of a USB Type-A male connector. For one or more embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For one or more embodiments, the additional circuitry 720 may include control circuitry, such as a memory controller, for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices and systems for a back gated SRAM cell are provided. One method embodiment for operating an SRAM cells includes applying a potential to a back gate of a pair of cross coupled p-type pull up transistors in the SRAM during a write operation. The method includes applying a ground to the back gate of the pair of cross coupled p-type pull up transistors during a read operation. The charge stored on a pair of cross coupled storage nodes of the SRAM is coupled to a front gate and a back gate of a pair of cross coupled n-type pull down transistors in the SRAM during the write operation and during a read operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a static random access memory (S RAM), comprising:
    applying a potential to a back gate of a pair of cross coupled p-type pull up transistors in the SRAM during a write operation;
    applying a ground to the back gate of the pair of cross coupled p-type pull up transistors in the SRAM during a read operation; and
    coupling a charge stored on a pair of cross coupled storage nodes of the SRAM to a front gate and a back gate of a pair of cross coupled pull down transistors in the SRAM during the write operation and during the read operation.

2. The method of claim 1, wherein the method includes applying the potential to a back gate of a pair of n-type pass transistors associated with opposite nodes of the SRAM during the write operation.

3. The method of claim 2, wherein applying the potential to the back gate of the pair of cross coupled p-type pull up transistors includes raising a threshold voltage |Vtl of the pair of cross coupled p-type pull up transistors during the write operation.

4. The method of claim 3, wherein applying the potential to the back gate of the pair of n-type pass transistors associated with opposite nodes of the SRAM during the write operation includes lowering a threshold voltage (Vt) of the pair of n-type pass transistors.

5. The method of claim 1, wherein the method includes applying the ground to a back gate of a pair of n-type pass transistors associated with opposite nodes of the SRAM during the read operation.

6. The method of claim 5, wherein applying the ground to the back gate of the pair of cross coupled p-type pull up transistors during the read operation includes lowering a threshold voltage |Vt| of the pair of cross coupled p-type pull up transistors during the read operation.

7. The method of claim 6, wherein applying the ground to the back gate of the pair of n-type pass transistors associated with opposite nodes of the SRAM during the read operation includes raising a threshold voltage (Vt) of the pair of n-type transistors.

8. The method of claim 1, wherein the pair of cross coupled pull down transistors are a pair of cross coupled n-type pull down transistors.

9. A method for operating a static random access memory (SRAM), comprising:
applying a potential to a back gate of a pair of cross coupled p-type pull up transistors in the SRAM during a write operation;
applying a ground to the back gate of the pair of cross coupled p-type pull up transistors during a read operation; and
coupling a charge stored on a pair of cross coupled storage nodes of the SRAM to a front gate and a back gate of a pair of cross coupled n-type pull down transistors in the SRAM during the write operation and during a read operation.

10. The method of claim 9, wherein the method includes applying the potential to a back gate of a pair of n-type pass transistors associated with opposite nodes of the SRAM during the write operation.

11. The method of claim 9, wherein the method includes applying the ground to a back gate of a pair of n-type pass transistors associated with opposite nodes of the SRAM during the read operation.

12. A method for operating a static random access memory (SRAM), comprising:
applying a first potential to a back gate of a pair of cross coupled p-type pull up transistors in the SRAM during a write operation;
applying the first potential to a back gate of a pair of n-type pass transistors associated with opposite nodes of the SRAM during the write operation;
applying a second potential to the back gate of the pair of cross coupled p-type pull up transistors during a read operation; and
applying the second potential to the back gate of the pair of n-type pass transistors associated with opposite nodes of the SRAM during the read operation.

13. The method of claim 12, wherein applying the first potential to the back gate of the pair of cross coupled p-type pull up transistors includes raising a threshold voltage |Vt| of the pair of cross coupled p-type pull up transistors.

14. The method of claim 12, wherein applying the first potential to a back gate of a pair of n-type pass transistors associated with opposite nodes of the SRAM during the write operation includes lowering a threshold voltage (Vt) of the pair of n-type pass transistors.

15. The method of claim 12, wherein applying the second potential to the back gate of the pair of cross coupled p-type pull up transistors during a read operation includes lowering a threshold voltage |Vt| of the pair of cross coupled p-type pull up transistors.

16. The method of claim 12, wherein applying the second potential to the back gate of the pair of n-type pass transistors associated with opposite nodes of the SRAM during the read operation includes raising a threshold voltage (Vt) of the pair of n-type transistors.

17. The method of claim 12, wherein the method includes coupling a charge stored on a pair of cross coupled storage nodes of the SRAM to a front gate and a back gate of a pair of cross coupled n-type pull down transistors in the SRAM during the write operation and during a read operation.

18. The method of claim 12, wherein the method includes inverting the first potential applied to the pair of n-type pass gate transistors during the write operation and applying the inverted first potential to a back gate of a pair of cross coupled n-type pull down transistors in the SRAM during the write operation.

19. The method of claim 12, wherein the method includes inverting the second potential applied to the pair of n-type pass gate transistors during the read operation and applying the inverted second potential to a back gate of a pair of cross coupled n-type pull down transistors in the SRAM during the write operation.

20. A method of forming a static random access memory (SRAM), comprising:
cross coupling a pair of inverters, wherein each inverter includes a p-type FinFET pull up transistor having a front gate and a back gate, and wherein each inverter includes an n-type FinFET pull down transistor having a front gate and a back gate, wherein the front gates of a first inverter in the pair are coupled to a first storage node and the front gates of a second inverter in the pair are coupled to a second storage node;
coupling a first n-type FinFET pass gate transistor having a front gate and a back gate to the first storage node;
coupling a second n-type FinFET pass gate transistor having a front gate and a back gate to the second storage node;
coupling a back gate control line to the back gates of the p-type FinFET pull up transistors and the n-type FinFET pass gate transistors to oppositely affect a threshold voltage in the p-type FinFET pull up transistors and the n-type FinFET pass gate transistors in during a read operation and during a write operation.

21. The method of claim 20, wherein the method coupling the front gates and the back gates of the n-type FinFET pull down transistors together.

22. The method of claim 20, wherein the method includes coupling the back gates of the n-type FinFET pull down transistors to an inverted signal from the back gate control line to oppositely affect a threshold voltage in the n-type FinFET pass gate transistors and the n-type FinFET pull down transistors during a read operation and during a write operation.

23. A static random access memory (SRAM), comprising:
a cross coupled pair of inverters, wherein each inverter includes a p-type FinFET pull up transistor having a front gate and a back gate, and wherein each inverter includes an n-type FinFET pull down transistor having a front gate and a back gate, wherein the front gates of a first inverter in the pair are coupled to a first storage node and the front gates of a second inverter in the pair are coupled to a second storage node;

a first n-type FinFET pass gate transistor coupled to the first storage node, the first n-type FinFET having a front gate and a back gate;
a second n-type FinFET pass gate transistor coupled to the second storage node, the second n-type FinFET having a front gate and a back gate;
a back gate control line coupled to the back gates of the p-type FinFET pull up transistors and the n-type FinFET pass gate transistors to oppositely affect a threshold voltage in the p-type FinFET pull up transistors and the n-type FinFET pass gate transistors in during a read operation and during a write operation.

24. The SRAM of claim 23, wherein the front gates and the back gates of the n-type FinFET pull down transistors are coupled together.

25. The SRAM of claim 23, wherein the back gates of the n-type FinFET pull down transistors are coupled to an inverted signal from the back gate control line to oppositely affect a threshold voltage in the n-type FinFET pass gate transistors and the n-type FinFET pull down transistors during a read operation and during a write operation.

* * * * *